Figure 1:
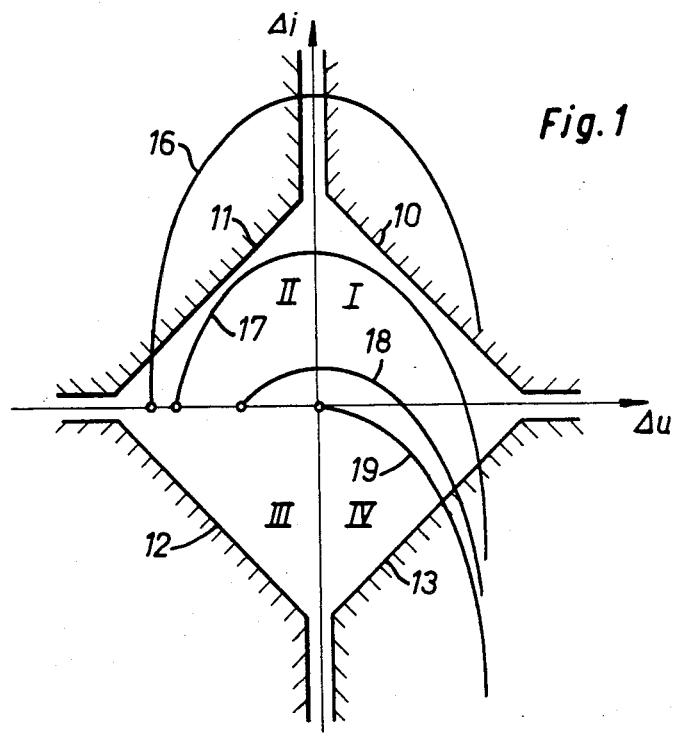

United States Patent [19]

Lanz

[11] Patent Number: 4,599,556

[45] Date of Patent: Jul. 8, 1986

[54] METHOD FOR DETECTING A DISTURBANCE ALONG A CONDUCTOR IN AN ELECTRICITY-DISTRIBUTION SYSTEM OF THE GRID TYPE

[75] Inventor: Otto Lanz, Niederrohrdorf, Switzerland

[73] Assignee: BBC Brown, Boveri & Company, Limited, Baden, Switzerland

[21] Appl. No.: 457,367

[22] Filed: Jan. 12, 1983

[30] Foreign Application Priority Data

Jan. 15, 1982 [CH] Switzerland .................. 230/82

[51] Int. Cl.⁴ .................. H02H 3/40; G01R 31/08
[52] U.S. Cl. .................. 324/52; 361/82
[58] Field of Search .................. 324/51, 52; 361/82, 361/86, 78, 79

[56] References Cited

U.S. PATENT DOCUMENTS 4,063,163 12/1977 Vitins .................. 324/52
4,063,164 12/1977 Lanz .................. 324/52
4,063,166 12/1977 Glavitsch .................. 324/52
4,287,547 9/1981 Vitins .................. 361/86

OTHER PUBLICATIONS

Muller, Leonhard: "The Selective Protection of Electrical Installations"—Brown Boveri Journal—1971.

Primary Examiner—Stanley T. Krawczewicz
Assistant Examiner—Jose M. Solis
Attorney, Agent, or Firm—Burns, Doane, Swecker & Mathis

[57] ABSTRACT

In an electrical power distribution system, line disturbances produce voltage and current travelling waves, or step-change signals, that are phase-shifted 90° relative to each other. A simulation signal is derived from the current step-change signal and is in phase with the voltage step-change signal. The two in-phase signals are combined and compared with established limit values to determine when a fault occurs.

11 Claims, 4 Drawing Figures

METHOD FOR DETECTING A DISTURBANCE ALONG A CONDUCTOR IN AN ELECTRICITY-DISTRIBUTION SYSTEM OF THE GRID TYPE

The present invention relates to a method for detecting a disturbance along a conductor in an electricity-distribution system of the grid type, in which method step-change signals are formed from input signals corresponding to the abrupt changes in current and/or voltage which are caused by a disturbance or a load-change. These step-change signals are logically combined in order to form a combination-signal which is compared with a preset limiting value in order to distinguish between a disturbance and a permissible load-change, as well as to determine the direction of the disturbance, relative to the location at which it is detected. The invention also relates to an apparatus for implementing this method.

The electrical power generated by one or more power stations is distributed to the consumers by means of systems of the grid type, which are designed to enable the supply to be uniform in nature, and to permit the power-station loads to be as uniform as possible, even when the consumption is subject to marked fluctuations. The grid-type distribution systems are subdivided into sections which can be disconnected, one from another, in order to prevent the entire distribution system from being adversely affected in the event of a disturbance, for example a line short-circuit. A monitoring apparatus is assigned to each section. This apparatus, on detecting a disturbance, generates a fault-signal which effects the disconnection, from the grid system, of the section in which the disturbance has occurred.

In order to monitor a line for possible disturbances, the manner in which the current and the voltage vary, as a function of time, is observed. The monitoring is conventionally located, for practical reasons, in the vicinity of a grid-system junction point. The evaluation of abrupt changes in the variation of the current, and of the voltage, as a function of time, is subject to the following rules: (a) if the current-flow collapses or rises abruptly, the location of the disturbance or load-change is situated between the power source and the monitoring station or, as the case may be, between the monitoring station and the loads, (b) the magnitudes of the changes in the current and the voltage enable a permissible load-change to be distinguished from a disturbance which cannot be permitted, and (c) the voltage always collapses in the vicinity of the monitoring station, irrespective of whether the location of the disturbance is situated between the monitoring station and the power source, or between the monitoring station and the loads, ie, irrespective of whether it is situated, in the direction of current-flow, in advance of the monitoring station, or after it.

The utilization of these rules has led to monitoring apparatuses in which the abrupt changes in both the current and the voltage are compared with preset, fixed limiting values, a fault-signal being triggered in the event of a limiting value being exceeded. The signs of the current and voltage changes are compared with each other and, from this comparison, the direction of the fault, relative to the monitoring station, is determined.

As every person skilled in the art is aware, the abrupt changes in the current, and in the voltage, which occur in the event of a disturbance or load-change, and their onward transmission, in the form of a travelling wave, are influenced by the voltage phase-angle at the instant at which the disturbance or load-change occurs, as well as by the impedance of the line and, in particular, of the power source. For this reason, the monitoring apparatuses described above exhibit triggering-sensitivities which depend, in a comparatively pronounced manner, not only on the voltage phase-angle at the instant corresponding to the disturbance or load-change, but also, in particular, on the source impedance. In order to rectify these shortcomings, a method is indicated, in German Auslegeschrift No. 2,841,009, in which method step-change signals are evaluated which correspond to the differences between the "normal" current and voltage waveforms, and the changed current and voltage waveforms which are brought about by a disturbance, or by a load-change. Either one of the two step-change signals is compared with a limiting value which is formed from the other step-change signal in accordance with a preset function. Alternatively a combination-signal being formed, according to a preset combination-rule, from the step-change signals corresponding to the changes in the current and voltage, and this combination-signal is compared with a fixed limiting value. These limiting values are preferably used, as triggering-values, in a rectangular-coordinate system, the axes of which are respectively assigned to the current and voltage step-signals. The limiting values are inclined with respect to the coordinate-axes and their form and position are adjustable in order to match the grid-system and line configurations to be monitored in practical cases and, in particular, to match the impedances of the power source and of the line. By this means, it is possible to reduce, quite substantially, the extent to which the triggering-sensitivity depends on the source impedance, and to correspondingly increase the safety-margin with respect to spurious triggering.

In the abovementioned coordinate system, the variation as a function of time of the combination-signal which is formed, in accordance with the Auslegeschrift which has been cited, by a rational function and, preferably, by a linear combination of the step-change signals, corresponds, particularly on account of the current/voltage phase-shift, to a curved path, which resembles an ellipse and which, in the following text, is also called a trajectory. This path is shifted along the coordinate axis assigned to the current step-change signal by an amount depending on the voltage phase-angle at the instant at which the disturbance or load-change occurred. As a result, there is a possibility, if the boundary conditions are appropriate, that the (curved) combination-signal will not clearly intersect the limiting value (inclined with respect to the coordinate axes), but that it will approach the limiting value in a tangential manner which can bring about spurious triggering of a fault-signal, or can suppress or delay a fault-signal, or generate an incorrect direction-indication. The possibility of triggering an unjustified fault-signal is further increased by the fact that the trajectory, which is filtered from a mixture of time-variable signals, is only approximately elliptical or circular, because the current step-signal, if not generated in the region of the maximum of the grid-voltage cycle, contains a direct-current component which decays exponentially and distorts the trajectory, and because the form of the trajectory also depends, in the end, on the impedance of the power source.

The object underlying the present invention was accordingly to improve the method described in the abovementioned Auslegeschrift, and to eliminate the shortcomings which have been indicated in respect of this method.

This object is achieved, according to the invention, by means of a method of the type mentioned in the introduction, wherein, by shifting the development, as a function of time, of at least one of the input signals, the phase-shift between the two step-change signals is virtually cancelled and the two step-change signals are superposed in order to form a combination-signal, the variation of which, as a function of time, in a rectangular-coordinate system, corresponds virtually to a straight line, the axes of this system being assigned to the two step-change signals.

By using the new method, it is possible to avoid the tangential approach of the combination-signal to a preset limiting value and, by this means, to prevent a fault-signal from being incorrectly triggered, suppressed, or delayed as a result of this type of approach.

In a preferred embodiment of the new method, the current step-signal, which follows the voltage step-signal, is shifted in the forward sense, by conversion into a dependent voltage step-signal, thereby achieving the result that any fault-signal which may be necessary is triggered within the shortest possible timespan.

In a further, preferred embodiment of the new method, a replica of the impedance of the power source is used for the conversion of the current step-signal into a forward-shifted, dependent voltage step-signal. By this means, it is possible to eliminate the direct-current component of the current step-signal which decays exponentially and, in general, occurs when the disturbance or load-change is not simultaneous with the maximum of the alternating voltage on the line. The influence of this direct-current component on the combination-signal, or trajectory, can be cancelled.

Figure 2:
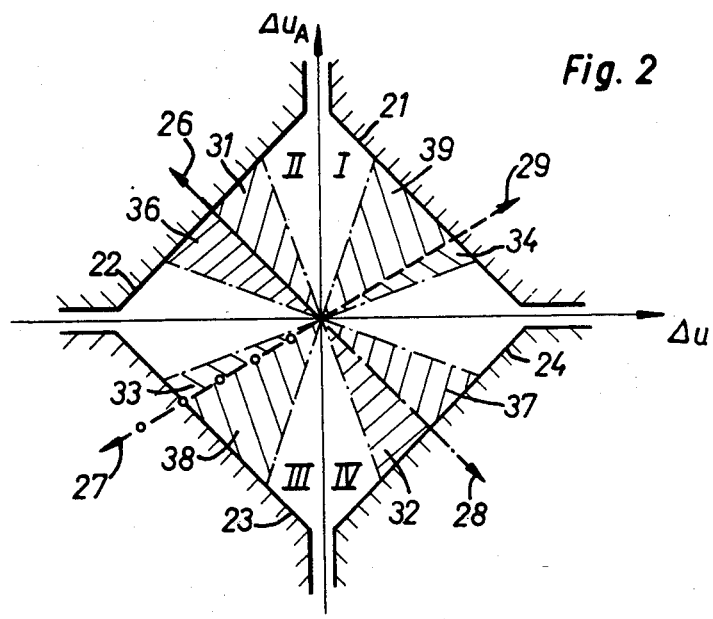
Figure 3:
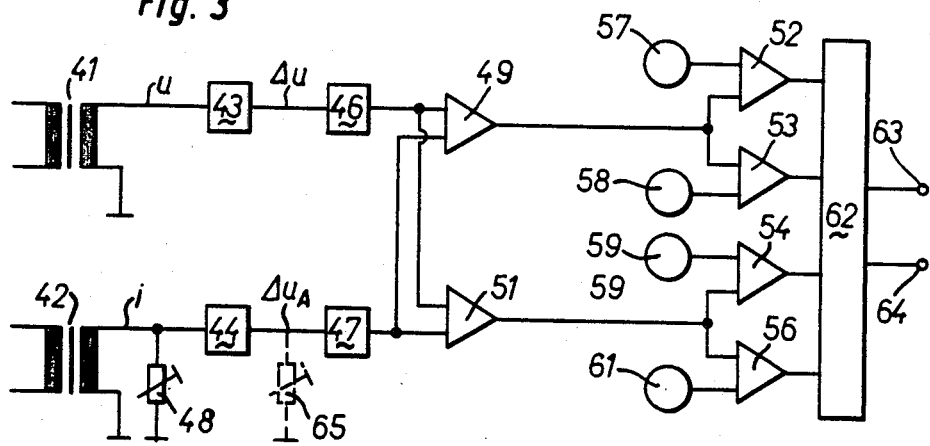
Figure 4:
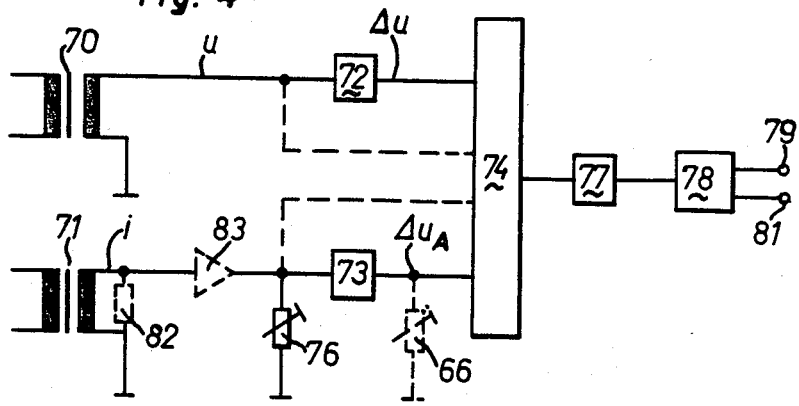

In the text which follows, the method according to the invention is described with the aid of Figures and by reference to two preferred embodiments of apparatuses for implementing this method. In the Figures:

FIG. 1 shows a diagrammatic representation of the variation of the combination-signals, as a function of time, in accordance with the state of the art, FIG. 2 shows a diagrammatic representation of the variation, as a function of time, of combination-signals according to the present invention, and FIGS. 3 and 4 respectively show block diagrams of a first embodiment and of a second embodiment of an apparatus for implementing the method according to the invention.

For a better understanding of the advantages which can be obtained by means of the present invention, the rectangular-coordinate system, disclosed in the German Auslegeschrift cited in the introduction, is shown in FIG. 1. Its abscissa is assigned to the voltage step-signals $\Delta U$, and its ordinate is assigned to the current step-signals $\Delta I$. A preset limiting value is drawn in each quadrant of the coordinate system, these values being marked, respectively, 10, 11, 12 and 13. In addition, trajectories 16, 17, 18 and 19 are shown, which correspond to the variation, as a function of time, of combination-signals. The voltage step-signals assigned to these combination-signals appear when the grid-system voltage reaches its maximum, 30° and 60° after this maximum, and when the grid-voltage passes through zero.

As the Figure shows, the trajectories from elliptical paths, their starting points lying on the $\Delta$ U-axis at positions which are displaced from the origin by amounts which depend on the grid-system voltage phase-angle at which the voltage step-signal is generated. The corresponding displacement of the center-point of the ellipse on the $\Delta$ I-axis leads to the result that, in the example chosen, the trajectory 19, the starting point of which is located at the origin, and which is displaced, from the origin, by the greatest amount, intersects the nearest limiting value, 13, in Quadrant IV and triggers a fault-signal of assured reliability, while the two trajectories 18 and 17, with starting points which are located between the trajectories 16 and 19, run in Quadrants II and I, within the area enclosed by the limiting values 11 and 10 respectively, and intersect the limiting value 13 only in Quadrant IV. This means not only that the triggering of the corresponding fault-signals is delayed, but that the tangential approach, for example of trajectory 17 to the limiting value 10, can trigger a fault-signal with an incorrect direction-indication. The possibility that an unjustified fault-signal will be triggered, or that an incorrect fault-direction will be indicated, is all the greater because, as has already been described by way of introduction, the path of the trajectory can, in practice, be markedly distorted with respect to the simulated paths shown in the Figure.

FIG. 2 shows a rectangular-coordinate system, the abscissa of which is assigned to the voltage step-signals $\Delta U$ and the ordinate of which is assigned to the replica voltage step-signals $\Delta U_a$, which are derived from the current step-signals and are virtually in phase with the voltage step-signals. Limiting values are drawn in the four quadrants of the coordinate system, these values being marked, respectively, 21, 22, 23 and 24. Due to the fact that the voltage step-signal and the replica voltage step-signal are virtually in phase, the starting point of the trajectory is located at a point which depends on the phase-angle of the grid-system voltage at the instant corresponding to the occurence of the disturbance or load-change on the corresponding trajectory. For the same reason, the trajectories corresponding to the form, as a function of time, of the combination-signals are no longer circular or elliptical, but are degraded virtually to straight lines. These straight lines pass through the origin, irrespective of the phase-angle of the grid-system voltage at which a voltage step-signal is generated, and are not influenced by a direct-current component in the current step-signal (which is largely suppressed on employing a replica impedance corresponding to that of the power source), and is only slightly influenced by the quality of the filtering of the original input signal. Only the angle of the trajectory, with respect to the coordinate-axes, alters as a function of the ratio of the impedance of the power source to the replica impedance. The trajectories shown, 26, 27, respectively correspond to a disturbance in the forward direction and in the backward direction, occurring during the positive half-wave of the grid-system voltage, while the trajectories 28 and 29 respectively correspond to a disturbance in the forward direction and in the backward direction during the negative half-wave of the grid-system voltage. The direction of the trajectories which is shown (45° to the coordinate-axes) corresponds (if an appropriate scale is selected for the coordinates) to a ratio of the impedance of the power source to the replica impedance, of 1:1. If the impedance of the power source is smaller than that of the replica impedance, the trajectory is rotated into the adjacent, shaded region, 31, 32, 38 or 39, and if the impedance of the power source exceeds that of the replica impedance, the trajectory is then rotated into the adjacent region, 36, 37, 33 or 34.

Any person skilled in the art is capable of constructing the trajectories from the step-change signals, for which reason their derivation is dispensed with.

FIG. 3 shows the block circuit diagram of a first embodiment of an apparatus for implementing the method according to the invention. The apparatus contains two input transformers, 41, 42, which are connected, on their primary sides, to the grid-type line system which is to be monitored, either directly or via suitable transducers (not shown). The signal output-terminal of each input transformer is connected, via the respective band-rejection filter, 43 or 44, to the input terminal of a dedicated amplifier, 46 or 47. In addition, a phase-shifting replica impedance 48, i.e. an impedance such as the inductive element reactor shown in the Figure, is connected to the link-line between the signal output-terminal of one of the input transformers 42, and the series-connected band-rejection filter 44. The output terminals of the two amplifiers are connected to the input terminals of a summing amplifier 49 and to the input terminals of a differential amplifier 51. The apparatus further contains two pairs of comparators, 52, 53 and 54, 56, the inverting input terminal and the associated non-inverting input terminal of one of the comparators of each pair respectively being connected, in each case, either to the output terminal of one of the computing amplifiers and to a fixed-value generator, 57 or 58, or 59 or 61, or vice versa. The output terminals of all the comparators are connected to assigned input terminals of a logic circuit 62 which possesses two output terminals which are connected to the output-signal terminals 63, 64.

For the purpose of describing the mode of operation of this apparatus, it may be assumed that the voltage on the line to be monitored collapses, and that the current undergoes an abrupt change. A corresponding input signal, U, then appears at the signal output-terminal of the input transformer 41 which is assigned to the voltage, and a current input-signal I, which follows the voltage input-signal, appears at the signal output-terminal of the input transformer 42 which is assigned to the current. The current input-signal is transformed, at the connection-point of the replica circuit 48, into a replica voltage-signal $U_a$, in which at least the grid-frequency component is phase-shifted with respect to the current input-signal I and which, if the impedance-angle of the replica circuit corresponds to the impedance-angle of the power source, is approximately in phase with the voltage input-signal U. The input signal corresponding, when the line is undisturbed, to the grid-system frequency is held back by the band-rejection filters 43, 44, so that step-change signals appear at their output terminals only in the event of a disturbance or a load-change. The voltage step-signal $\Delta$ U and the replica voltage step-signal $\Delta U_a$ are then amplified, to values which can be compared, in the dedicated amplifiers 46 and 47 respectively. The amplified step-change signals are thereafter added in one of the computing amplifiers 49, and are subtracted in the other computing amplifier 51. In accordance with the rules which were described in the introduction, an output signal appears at the adding amplifier 49 if the cause of the step-change signals, seen in the direction of current flow, is located behind the apparatus, or an output signal appears at the output terminal of the subtracting amplifier 51 if the cause of the step-change signals is located in advance of the apparatus (this corresponding to a position of the trajectories, shown in FIG. 2, in Quadrants I or III, or in Quadrants II or IV of the coordinate system). The output signal from the computing amplifier, 49 or 50, is then compared, in the comparators 52, 53 or 54, 56 respectively, with a positive limiting value and a negative limiting value, these limiting values cooresponding to the values 23, 21 and 22, 24 respectively, which are shown in FIG. 2 and are supplied by adjustable limiting-value generators 57, 58 and 59, 61 respectively. If the combination-signal, formed in one of the computing amplifiers 49, 51, exceeds the corresponding limiting value, an output signal then appears at the comparator assigned thereto, which signal is processed in the logic circuit 62 and generates a fault-signal which can be picked off at one of the output terminals, 63 or 64, depending on the direction of the fault relative to the apparatus, in order, for example, to trigger a line-disconnection device.

FIG. 4 shows the block circuit diagram of another embodiment of an apparatus for implementing the method according to the invention. This embodiment likewise contains two input transformers 70, 71, which, as in the embodiment according to FIG. 3, are connected to the grid-system to be monitored directly or via a signal converter, which is not shown. The signal-output from each input transformer is led via a dedicated band-rejection filter, 72 or 73 respectively, to an input terminal of a multiplexer 74. A replica circuit 76 is connected to the link-line between the signal output-terminal of the input transformer 71 for the current step-signal, and the band-rejection filter 73 dedicated to that transformer, the impedance-angle of this replica circuit 76 corresponding to that of the power source. An analog/digital converter 77 is connected in series with the multiplexer, the output terminal of this converter being connected to the input terminal of a microprocessor 78. This microprocessor possesses two outputs, which are connected to output terminals 79, 81, one of which is provided for fault-signals resulting from disturbances in the forward direction, while the other is provided for fault-signals resulting from disturbances in the backward direction.

When this apparatus is being used, an abrupt change in voltage appearing on the line which is to be monitored is transmitted through the input transformer 70. The series-connected band-rejection filter 72 holds back the input signal corresponding, when the line is undisturbed, to the grid-system frequency, so that a voltage step-signal $\Delta$ U appears, at the filter output-terminal, only in the event of a disturbance or a load-change, this step-change signal being led onwards to the multiplexer. The abrupt change in the current, appearing on the line to be monitored, is transmitted through the input transformer 71. The output signal from the input transformer is led to the replica circuit 76, a replica voltage $U_a$ then appearing at the connection-point of this circuit, this replica voltage corresponding to the current input-signal and to the impedance-angle of the replica circuit. Since the replica circuit virtually cancels the phase-shift, relative to the voltage input-signal, caused by the impedance of the power source, of at least the grid-frequency component of the current input-signal, the phase-position of this replica voltage $U_a$ is also virtually identical to the phase-position of the voltage signal U. A voltage step-signal Δ U then appears at the output terminal of the band-rejection filter 72, and a replica voltage step-signal Δ $U_a$ appears at the output terminal of the band-rejection filter 73. The analog step-change signals are interleaved in the multiplexer 74 and are converted, in the series-connected analog/digital converter 77, into a sequence of digital signals. These digital signals are then processed in the microprocessor, the amplitudes and the signs of the two step-change signals being compared, thereby determining the direction of the cause of these step-change signals relative to the apparatus, and the combined step-signals being compared with preset limiting values in order to distinguish between a disturbance and a permissible load-change. If appropriate, a fault-signal is then formed which appears at one of the two output terminals 79 or 81, depending on the direction of the disturbance.

It is self-explanatory that the replica circuits, 48, 76, do not necessarily have to be connected to the input lines to the band-rejection filters 44 and 73 respectively, but can equally well be connected to the output line from the dedicated band-rejection filter, as shown in FIGS. 3 and 4 by the replica circuits 65 and 66, which are drawn with broken lines. It is self-explanatory, furthermore, that the additional replica circuits can be replaced by input transformers, 42, 71, which are designed as high-leakage transformers, with a resistor connected in parallel to each of their secondary windings.

If it is also intended to use the circuit, which has been described, for protection against switching-on faults, it can be advantageous to connect the two ends of the secondary winding of the input transformer 71 to a resistor 82, and to connect the signal output-terminals of the two input transformers, 70, 71, directly to an input terminal of the multiplexer, that is to say bypassing the series-connected band-rejection filter. It is then advantageous to connect an impedance converter 83 in the line between the signal output-terminal of the input transformer 71 which is assigned to the current, and the point at which the replica circuit 76 is connected. It is possible, furthermore, in the case of an embodiment with a microprocessor, to dispense with the bandpass filters (72, 73 in FIG. 4), and to connect the output terminals of the input transformers directly to the time-division multiplexing circuit (this being shown, in FIG. 4, by broken lines). The step-change signals are then formed in the microprocessor, which is programmed accordingly.

The new method has been described, in a simple manner, by reference to apparatuses for monitoring single-phase grid systems. As any person skilled in the art will immediately recognize, these circuits can be extended, without any inventive effort, to monitor multi-phase grid systems. The apparatuses can be constructed with commercially-available components, it being possible, within the scope of the capability of persons skilled in the art, to select that device, or that component, which is better suited to a given purpose and, for example, to use an analog/digital converter which is preceded by a sample-and-hold circuit.

I claim:

1. Apparatus for detecting a disturbance along a conductor in an electrical power distribution system; comprising:
   a pair of transformers respectively generating input signals corresponding to abrupt changes in the current and voltage of the conductor;
   a pair of filters for respectively removing steady-state, system-frequency components from said input signals;
   means for essentially cancelling any relative phase difference between said input signals;
   means for comparing the polarities of said input signals and for combining said signals to form a combination signal; and
   means for comparing the combination signal with a limit value.

2. The apparatus of claim 1 wherein said cancelling means is a circuit having an impedance that substantially corresponds to the impedance of the power source for the distribution system.

3. The apparatus of claim 2 wherein said circuit is connected between the transformer generating the current-related input signal and its associated filter.

4. The apparatus of claim 2 wherein said circuit is connected to an output terminal of the filter for the current-related input signal.

5. The apparatus of claim 2 wherein said circuit comprises the transformer for generating the current-related input signal, said transformer being a high-leakage transformer, and said circuit further includes a resistor connected in parallel with the secondary winding of said transformer.

6. The apparatus of claim 1, wherein said polarity comparing and combining means comprises a summing amplifier for adding said input signals and a differential amplifier for subtracting said input signals, and said limit comparing means comprises two pairs of comparators, the output terminals of each amplifier being respectively connected to one input terminal of each of the comparators in one of said pairs, the other input terminal of each comparator being connected to a signal generator producing a limit signal, and further including a logic circuit for producing a fault signal on one of two output terminals in response to the output signals from said comparators.

7. The apparatus of claim 1 including a time division multiplexing circuit for receiving and multiplexing the filtered input signals from said filters, and a microprocessor for receiving the multiplexed signal and performing the functions of said polarity and limit comparing means.

8. A method for detecting a disturbance along a conductor in an electrical power distribution system, comprising the steps of:
   generating two step-change input signals respectively corresponding to the voltage and the current in the conductor;
   shifting the phase of one of said input signals such that any relative phase-shift between the other input signal and the phase-shifted signal is substantially cancelled;
   combining said other input signal and said phase shifted signal to form a combination signal which varies linearly over time in a rectangular coordinate system whose axes correspond to said two step-change signals; and
   comparing said combination signal with a limit value to distinguish between load changes and line disturbances.

9. The method of claim 8 wherein the phase of the step-change input signal corresponding to the current in the conductor is advanced.

10. The method of claim 9 wherein said step-change input signal corresponding to the current in the conductor is converted into an equivalent voltage signal by replicating the impedance of the power source for the system.

11. Apparatus for detecting a disturbance along a conductor in an electrical power distribution system, comprising:

a pair of transformers respectively generating input signals corresponding to abrupt changes in the current and voltage on the conductor;

means for essentially cancelling any relative phase difference between said input signals;

a time-division multiplexing circuit for multiplexing said two input signals;

and analog-to-digital converter for transforming the multiplexed input signals into a digital signal; and a microprocessor for converting the digitized input signals into step-change signals, forming a combination signal from the step-change signals, determining the amplitude and sign of the step-change signals and the combination signal, and comparing the combination signal with limit values.

* * * * *